(12) United States Patent
Chen et al.

(10) Patent No.: US 11,854,996 B2
(45) Date of Patent: Dec. 26, 2023

(54) METHOD FOR FABRICATING SEMICONDUCTOR DEVICE

(71) Applicant: TAIWAN SEMICONDUCTOR MANUFACTURING CO., LTD., Hsinchu (TW)

(72) Inventors: Chiu-Hsiang Chen, Hsinchu County (TW); Shih-Chun Huang, Hsinchu (TW); Yung-Sung Yen, New Taipei (TW); Ru-Gun Liu, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 11 days.

(21) Appl. No.: 17/239,962

(22) Filed: Apr. 26, 2021

(65) Prior Publication Data
US 2021/0242136 A1 Aug. 5, 2021

Related U.S. Application Data

(62) Division of application No. 16/112,925, filed on Aug. 27, 2018, now Pat. No. 10,991,657.

(51) Int. Cl.
| | |
|---|---|
| *H01L 23/544* | (2006.01) |
| *H01L 27/02* | (2006.01) |
| *H01L 21/311* | (2006.01) |
| *H01L 21/3213* | (2006.01) |
| *H01L 21/308* | (2006.01) |
| *H01L 21/027* | (2006.01) |
| *G06F 30/392* | (2020.01) |

(52) U.S. Cl.
CPC ......... *H01L 23/544* (2013.01); *G06F 30/392* (2020.01); *H01L 21/0274* (2013.01); *H01L 21/308* (2013.01); *H01L 21/31144* (2013.01); *H01L 21/32139* (2013.01); *H01L 27/0207* (2013.01); *H01L 2223/54426* (2013.01)

(58) Field of Classification Search
None
See application file for complete search history.

(56) References Cited

U.S. PATENT DOCUMENTS

| | | | | |
|---|---|---|---|---|
| 5,656,402 | A | | 8/1997 | Kasuga |
| 6,020,249 | A | * | 2/2000 | Shih ............... G03F 9/708 257/E23.179 |
| 6,037,671 | A | * | 3/2000 | Kepler ............ H01L 23/544 257/E23.179 |
| 6,136,662 | A | * | 10/2000 | Allman ............ G03F 9/708 438/692 |
| 6,271,602 | B1 | * | 8/2001 | Ackmann ......... H01L 23/544 257/E23.179 |

(Continued)

*Primary Examiner* — Khaja Ahmad
(74) *Attorney, Agent, or Firm* — Birch, Stewart, Kolasch & Birch, LLP

(57) ABSTRACT

A method for fabricating a semiconductor device is provided. The method includes forming an alignment mark in a material layer, wherein the alignment mark has a step sidewall in the material layer, and the step sidewall of the alignment mark has a floor surface portion; forming a feature material over the material layer; and performing a planarization process at least on the feature material, wherein the planarization process stops at a level higher than the floor surface portion of the step sidewall of the alignment mark.

20 Claims, 18 Drawing Sheets

(56) References Cited

U.S. PATENT DOCUMENTS

| | | | |
|---|---|---|---|
| 6,673,635 B1* | 1/2004 | Hellig | H01L 23/544 |
| | | | 438/734 |
| 6,979,651 B1* | 12/2005 | Hellig | H01L 21/3081 |
| | | | 257/E23.179 |
| 2002/0192926 A1* | 12/2002 | Schroeder | G03F 9/7076 |
| | | | 257/E23.179 |
| 2004/0198017 A1* | 10/2004 | Chang | G03F 9/708 |
| | | | 257/E23.179 |
| 2005/0282396 A1* | 12/2005 | Lin | H01L 23/544 |
| | | | 257/E23.179 |
| 2006/0220265 A1 | 10/2006 | Noda et al. | |
| 2009/0138135 A1 | 5/2009 | Oishi et al. | |
| 2010/0211352 A1 | 8/2010 | Morinaga et al. | |
| 2013/0328221 A1 | 12/2013 | Tsai | |
| 2014/0315380 A1* | 10/2014 | Kanakasabapathy | |
| | | | H01L 21/0337 |
| | | | 438/618 |
| 2015/0037713 A1 | 2/2015 | Nakagawa et al. | |
| 2015/0360412 A1 | 12/2015 | Isobayashi | |

* cited by examiner

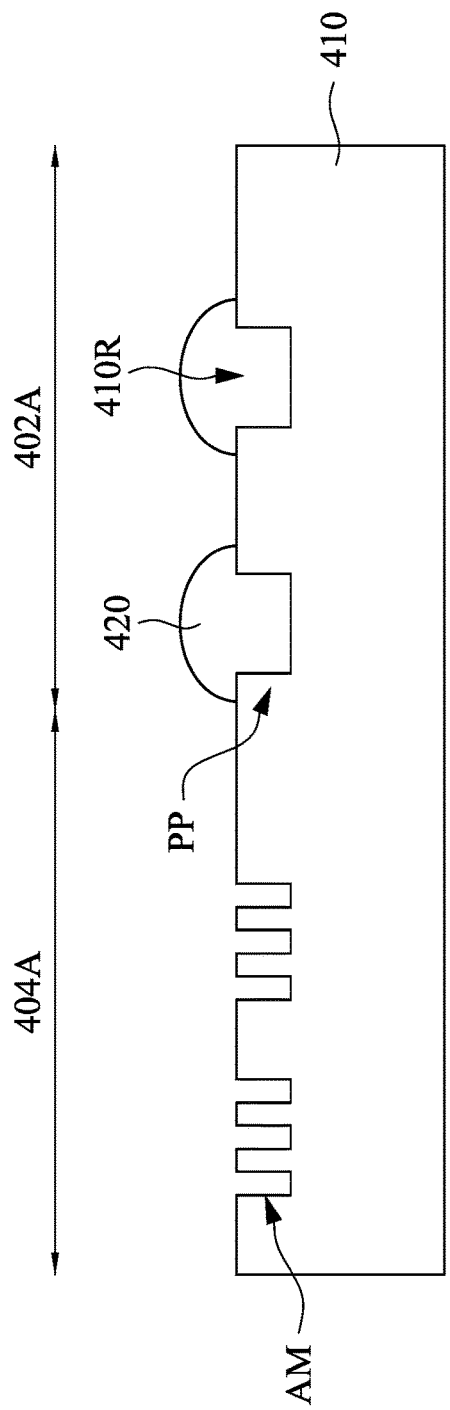
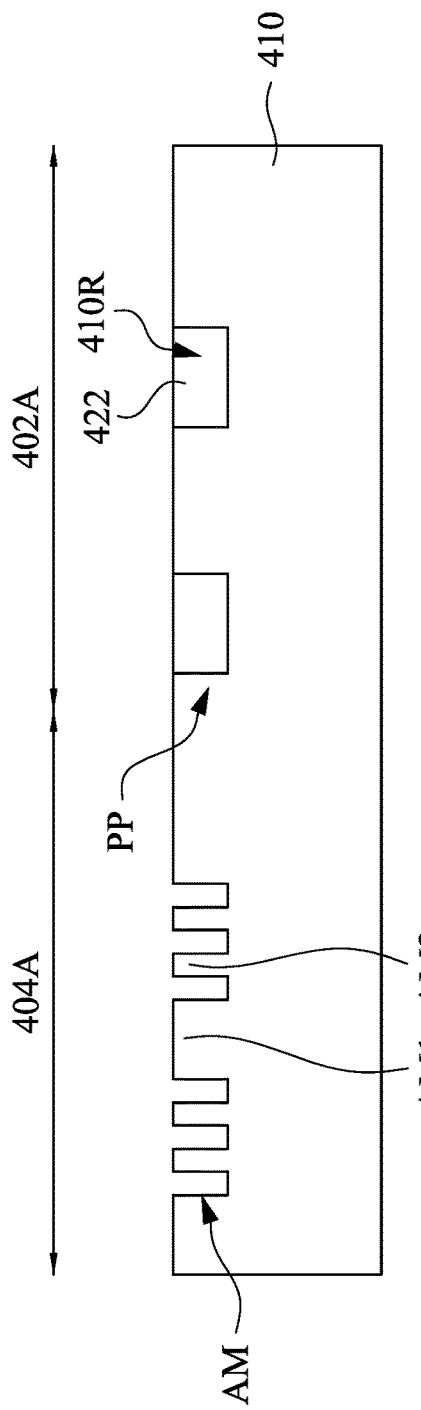

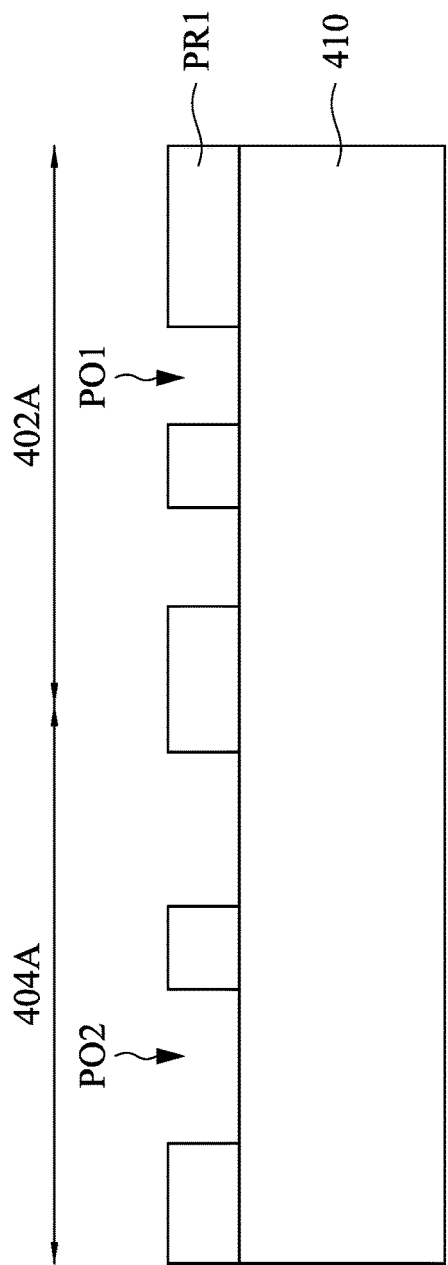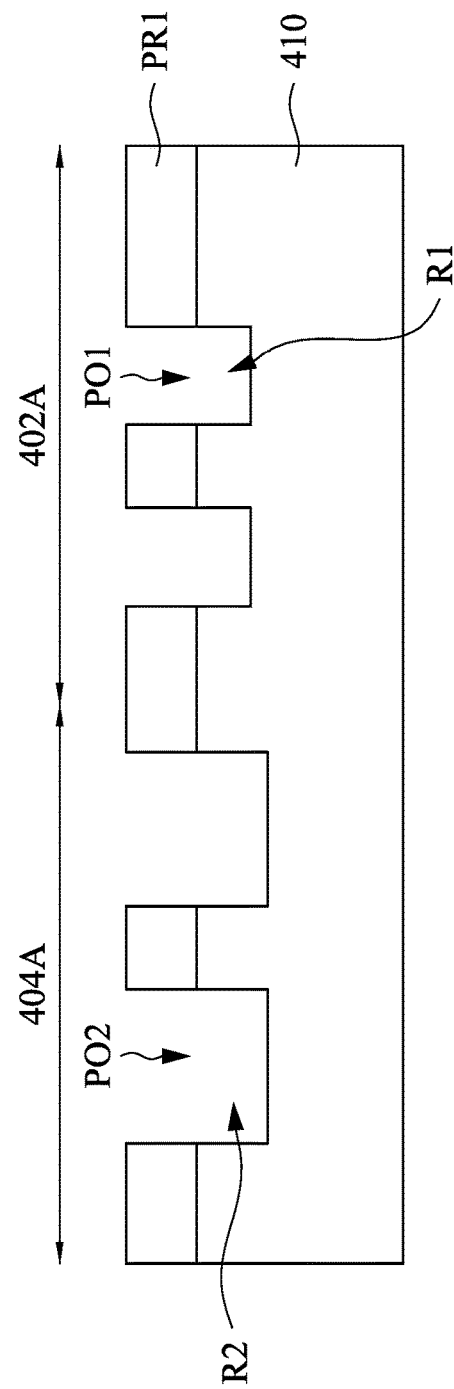
Fig. 9A
Fig. 9B

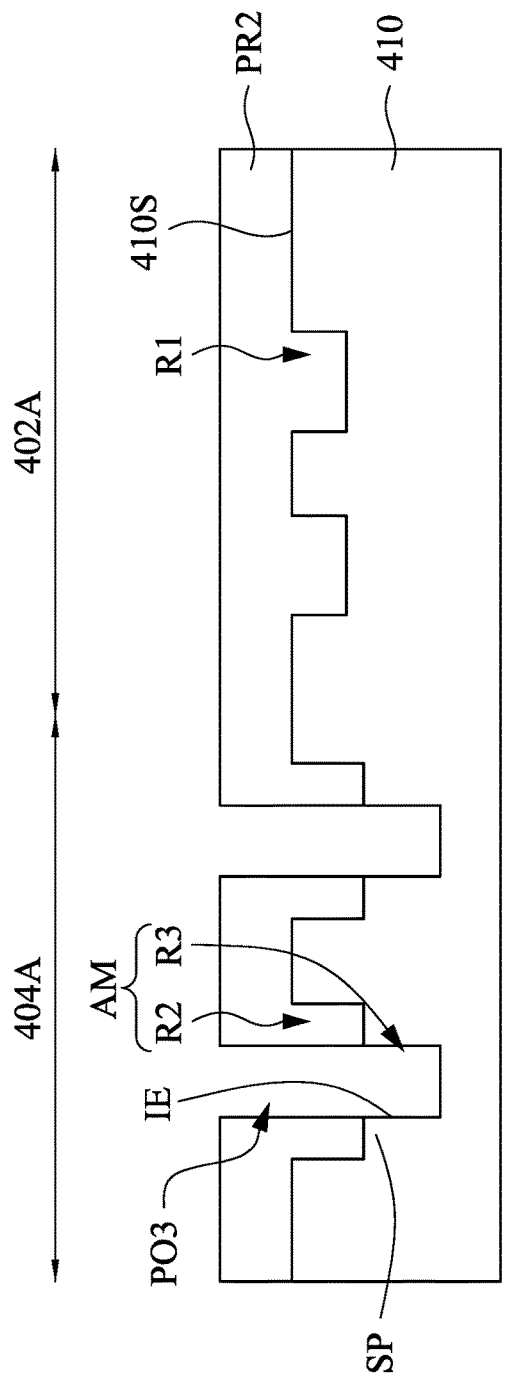
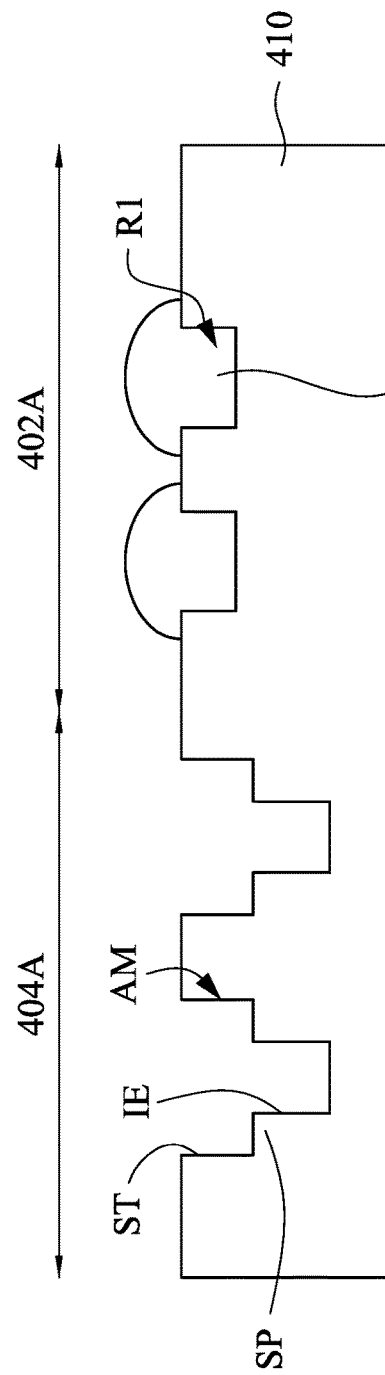

METHOD FOR FABRICATING SEMICONDUCTOR DEVICE

PRIORITY CLAIM AND CROSS-REFERENCE

This application is a divisional application of U.S. patent application Ser. No. 16/112,925, filed Aug. 27, 2018, now U.S. Pat. No. 10,991,657, issued Apr. 27, 2021, the entirety of which is incorporated by reference herein in their entireties.

BACKGROUND

The semiconductor integrated circuit (IC) industry has experienced rapid growth. Technological advances in IC materials and design have produced generations of ICs where each generation has smaller feature sizes and more complex circuits than those from the previous generation. Semiconductor devices are fabricated by patterning a sequence of patterned and un-patterned layers, and the features on successive patterned layers are spatially related to each other. During the fabrication, each patterned layer is aligned with the previous patterned layers with a degree of precision. Pattern alignment techniques typically provide alignment marks to achieve overall exposure field alignment. As technology nodes continue to decrease, it has been observed that such alignment techniques provide less than desirable alignment within the field.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A-6E illustrate various stages of a method for manufacturing a semiconductor device at in accordance with some embodiments respectively.

FIGS. 9A-9E illustrate various stages of a method for fabricating a semiconductor device at in accordance with some embodiments.

DETAILED DESCRIPTION

Figure 1:
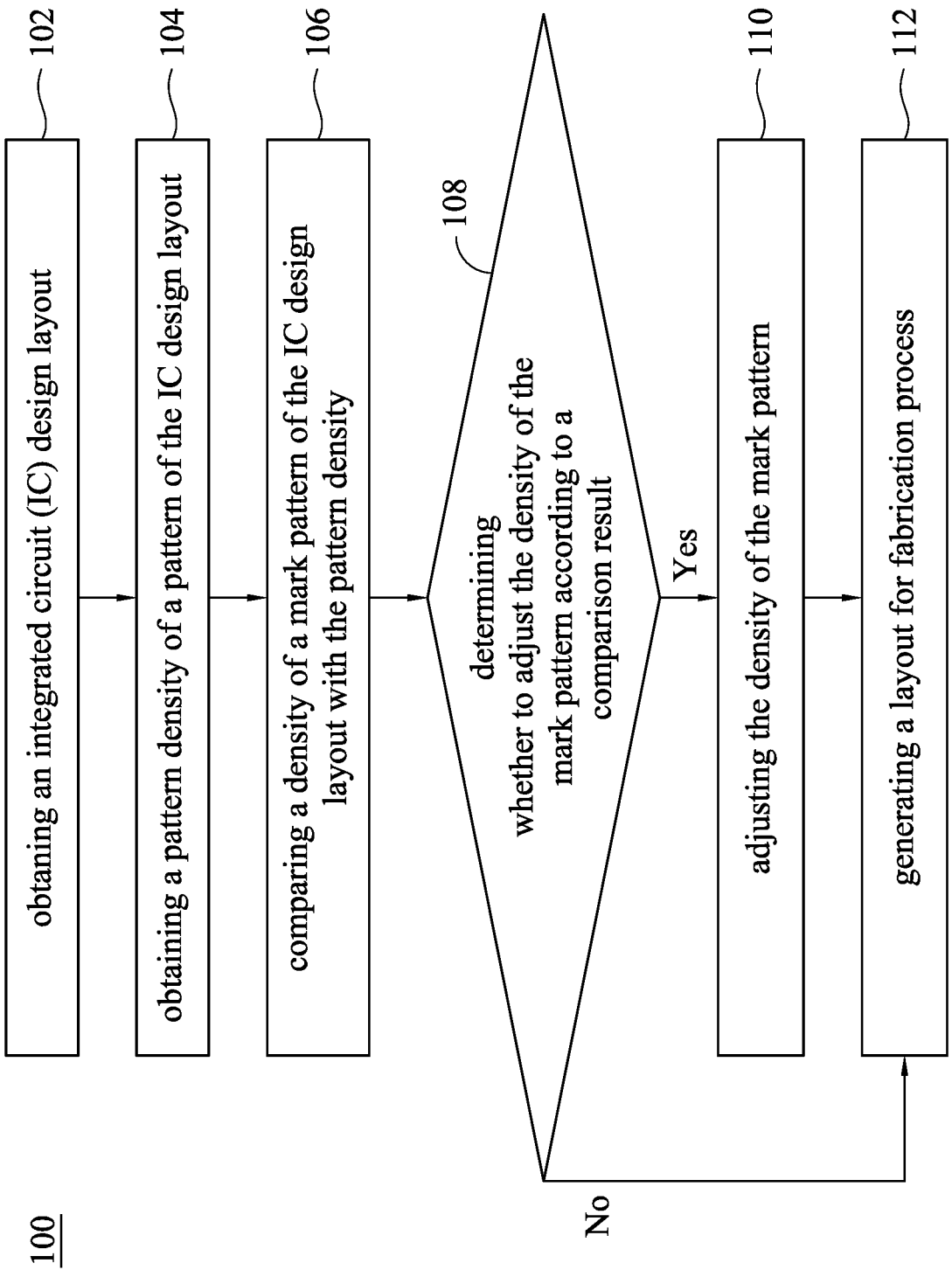
FIG. 1 is a flow chart of a method for preparing an IC design layout for fabrication process according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flow chart of a method 100 for preparing an integrated circuit (IC) design layout for fabrication process according to some embodiments of the present disclosure. The method 100 includes steps 102-112. The method 100 begins at step 102 where an integrated circuit (IC) design layout from design house is received and stored by a computing device. The IC design layout for the target wafer pattern includes plural patterns of plural layers to be formed.

Figure 2A:
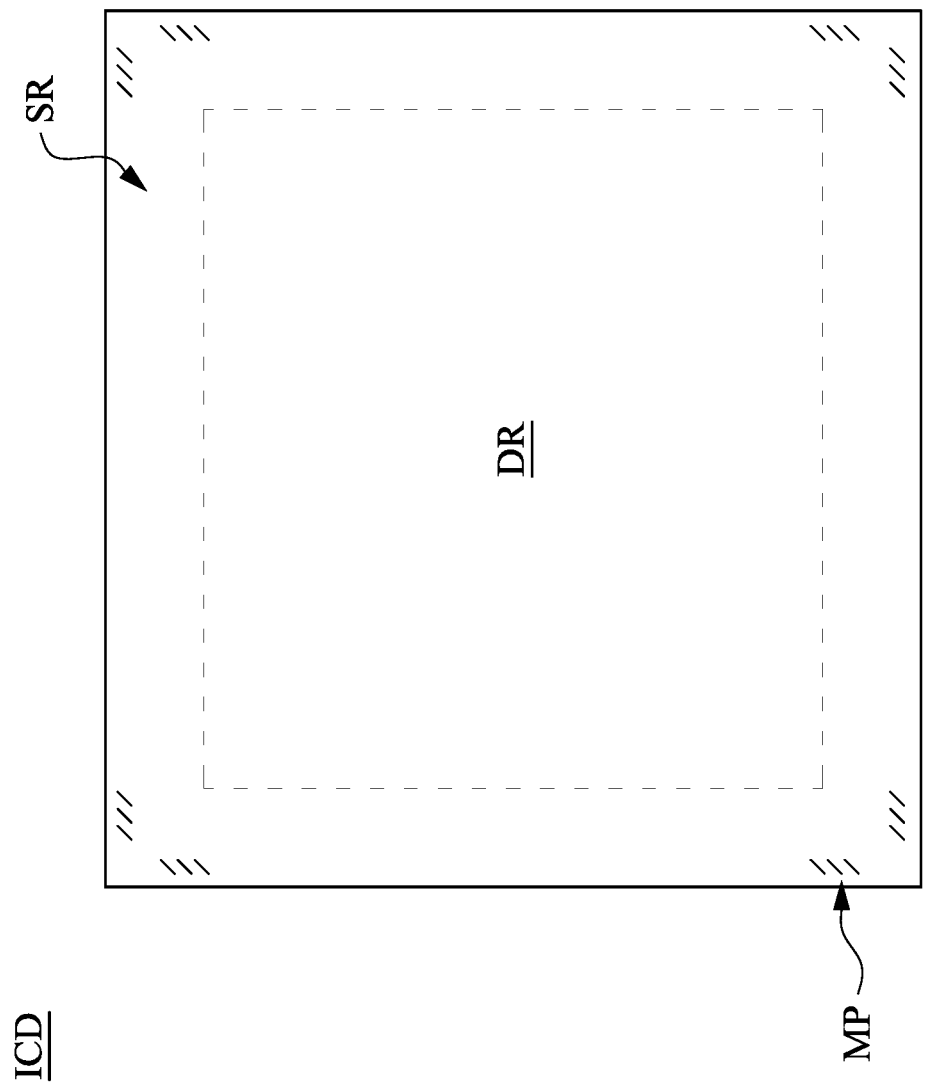
FIG. 2A is a simplified top view of a pattern of an integrated circuit design layout from design house according to some embodiments of the present disclosure.
Figure 2B:
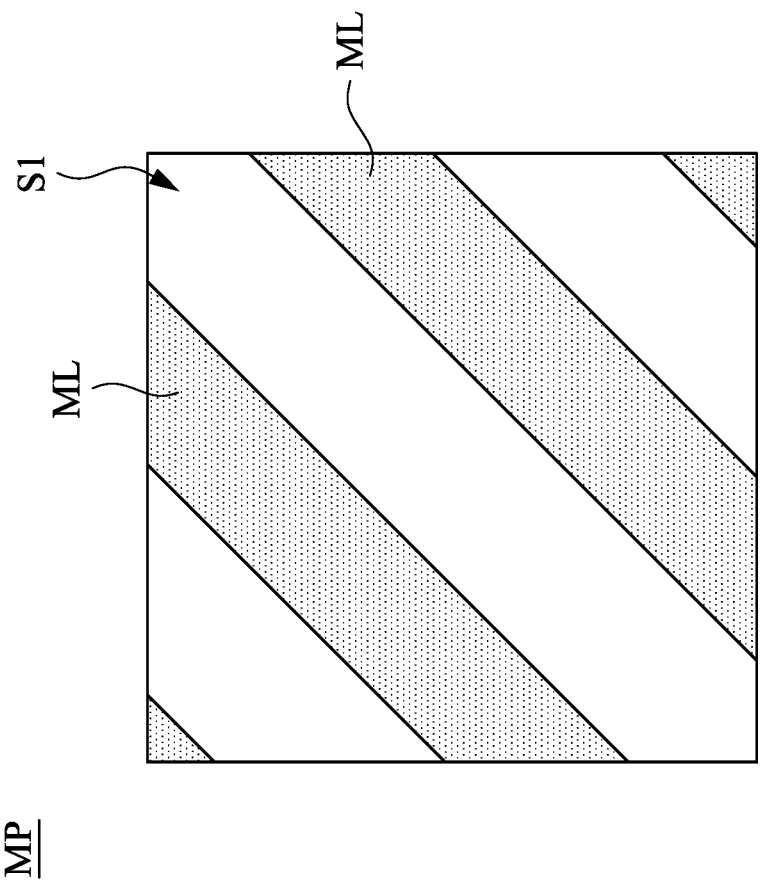
FIG. 2B is a top view of a mark pattern of the integrated circuit design layout of FIG. 2A.

For example, FIG. 2A is a simplified top view of an integrated circuit design layout ICD according to some embodiments of the present disclosure. The IC design layout may have a chip region DR and a scribe line region SR corresponding to a chip region and a scribe line region of a wafer. The IC design layout ICD may include various circuit patterns (not depicted) in the chip region DR and a mark pattern MP located in the scribe line region SR. The circuit patterns (not depicted) in the chip region DR are designed for an IC product based on specifications of an IC product to be manufactured. In some embodiments, the circuit patterns correspond to geometrical patterns formed in various material layers (such as metal layers, dielectric layers, and/or semiconductor layers) that combine to form IC features (components) of the IC product, such as IC device. For example, a portion of IC design layout ICD includes various IC features to be formed in a substrate (for example, a silicon wafer) and/or in various material layers disposed on the substrate. The various IC features can include an active region, a gate feature (for example, a gate dielectric or a gate electrode), a source region/feature and a drain region/feature, an interconnection feature (for example, conductive lines and/or conductive vias), bonding pad features, other IC feature, or combinations thereof. The mark pattern MP in the scribe line region SR are used for alignment. FIG. 2B is a top view of a mark pattern MP of the integrated circuit design layout ICD of FIG. 2A. The mark pattern MP may include plural parallel main lines ML and plural spaces S1, in which two adjacent main lines ML are spaced apart from each other by one of the spaces S1. In some embodiments, the spaces S1 may correspond with regions of a substrate to be recessed, while the main lines ML may correspond with non-recessed regions of a substrate.

The method 100 proceeds to step 104 where a pattern of the IC design layout ICD is analyzed by the computing device, and a pattern density thereof is calculated and obtained. The pattern being analyzed may include the circuit pattern in the chip region DR and the mark pattern MP in the scribe line region SR. For better illustration, it is noted that the pattern being analyzed may be a primary pattern, which is referred to as a pattern to be transferred to a primary layer (or a lower layer) of a substrate. Although the circuit pattern of the pattern (e.g., the primary pattern) is not depicted in the figures, it is noted that the circuit pattern may include recesses corresponded with a pattern of shallow-trench isolations, semiconductor fins, or other features.

In some embodiments, the pattern density is referred to as a ratio of the area of the pattern (e.g., a combination of the circuit pattern and the mark pattern MP) to the whole area of the IC design layout (e.g., the sum area of the chip region DR and the scribe line region SR). In some embodiments, the pattern density of the pattern may be a ratio of the non-recessed area (e.g., the sum area of the main lines ML in the scribe line region SR and the non-recessed area in the chip region DR) to a combination of the recessed area and the non-recessed area (e.g., the sum area of the scribe line region and the chip region DR). For example, the pattern density may be in a range of about 0% to about 90%.

The method 100 proceeds to step 106 where the computing device may compare the density of the mark pattern MP with the pattern density obtained at step 104, thereby providing a comparison result. For example, the difference between the density of the mark pattern MP and the pattern density obtained at step 104 is calculated herein.

Figure 3A:
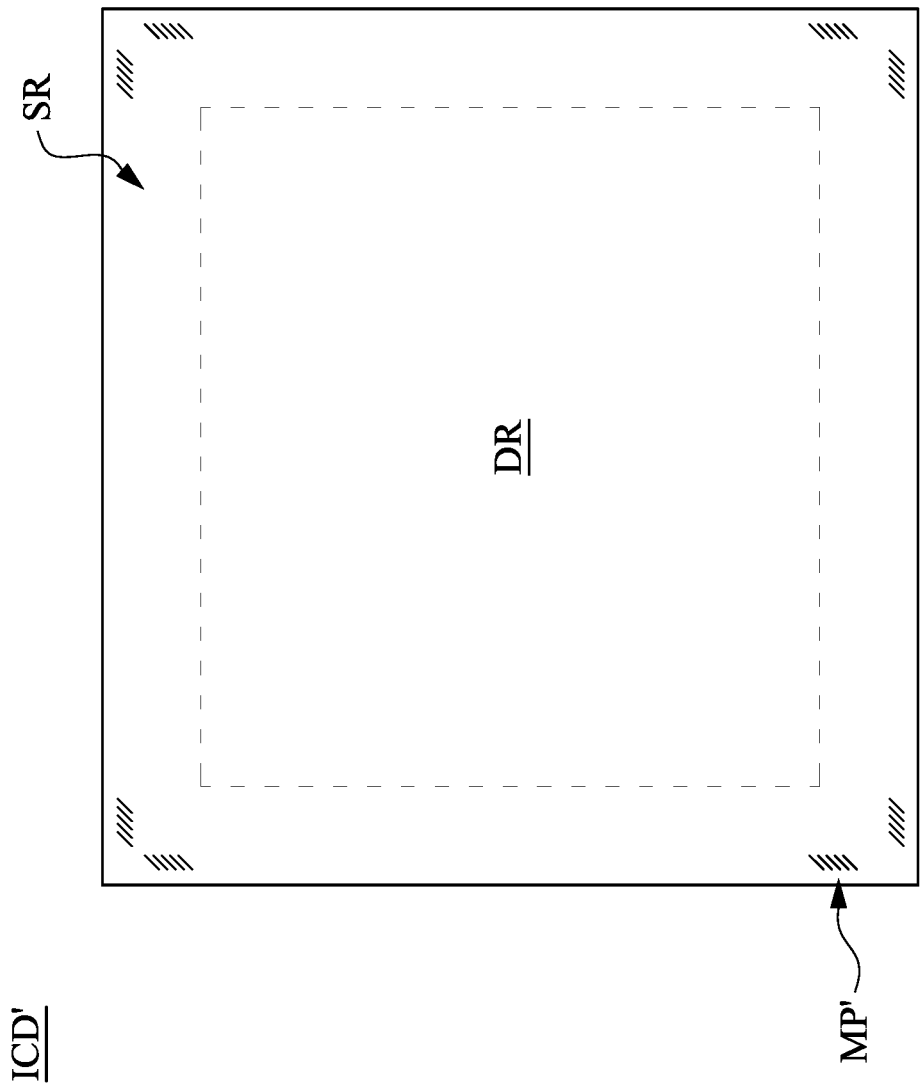
FIG. 3A is a simplified top view of a pattern of an integrated circuit design layout for fabrication process according to some embodiments of the present disclosure.

The method 100 proceeds to step 108 where whether to adjust the mark pattern MP is determined according to the comparison result. For example, if the comparison result shows a difference between the density of the mark pattern MP and the pattern density obtained at step 104 is greater than a determined value (e.g., a value in a range from about 0.1% to about 10%), the method 100 proceeds to step 110 where the mark pattern MP (referring to FIG. 2A) is adjusted according to the pattern density by the computing device, and then proceed to the step 112 where an IC design layout for fabrication process is generated with the adjusted mark pattern, as shown in FIG. 3A. Alternatively, if the comparison result shows a difference between the density of the mark pattern MP and the pattern density obtained at step 104 is less than a certain value (e.g., a value in a range from about 0.1% to about 10%, for example, about 5%), the method may skip the step 110 and proceed to the step 112 where an IC design layout for fabrication process is provided as the layout ICD shown in FIG. 2A.

Referring to FIG. 1 and FIG. 3A, FIG. 3A is a simplified top view of an IC design layout ICD' for fabrication process according to some embodiments of the present disclosure. The method 100 proceeds through step 110 to step 112 where mark pattern (referring to FIG. 2A) is adjusted and an IC design layout ICD' for fabrication process is generated. The adjusted mark pattern may be referred to as mark pattern MP'. In other word, the IC design layout ICD (referring to FIG. 2A) is modified to be the IC design layout ICD' that includes the adjusted mark pattern MP'. The layout ICD' for fabrication process includes the circuit pattern in the chip region DR and the mark pattern MP' in the scribe line region SR. Herein, the adjustment reduces a difference between a density of a mark pattern of the IC design layout and the pattern density obtained at step 104, for example, by increasing or reducing the density of the mark pattern. To be specific, a difference between a density of a mark pattern MP' of the IC design layout ICD' (referring to FIG. 3A) and the pattern density obtained at step 104 is less than a difference between a density of a mark pattern MP of the IC design layout ICD (referring to FIG. 2A) and the pattern density obtained at step 104. In some examples where the difference between the pattern density at step 104 and the density of the mark pattern MP is in a range of 10% to 100% (e.g., a range of 20% to 90%), and the difference between the pattern density at step 104 and the density of the mark pattern MP' reduced to be in a range of 0% to 10%. For example, in some examples where the pattern density obtained at step 104 is in a range from about 45% to about 55% (e.g., about 50%) and the density of the mark pattern MP (referring to FIG. 2A) is in a range from about 0% to about 30%, the mark pattern MP' (referring to FIG. 3A) is designed to have a density in a range from about 35% to about 65% (e.g., from about 40% to about 60%).

In some embodiments, the mark pattern MP' is designed to have a density substantially equal to the pattern density obtained at step 104. For example, the mark pattern MP' and the pattern density obtained at step 104 both have substantially the same density in a range from about 0% to about 90%, such as about 30%, 40%, 50%, 60%, 70%, or 80%. In some embodiments, a tolerance range from about 0% to about 10% may be given to the design of the mark pattern MP'. That is, the mark pattern MP' may be designed such that the difference between the density of the mark pattern MP' and the pattern density is in a range of about 0% to about 10%. For example, the pattern density obtained at step 104 is in a range of about 45% to about 55% (e.g., about 50%), and the mark pattern MP' is designed to have a density of in a range from about 35% to about 65% (e.g., from about 40% to about 60%). The tolerance range may be designed according to actual requirements, and not limited to the numeral value shown herein. For example, in some other embodiments, the tolerance range may be from about 0% to about 20%. In some embodiments, the computing device further receives some user-determined parameters, such as tolerance values, and then generates the mark pattern MP'.

Figure 3B:
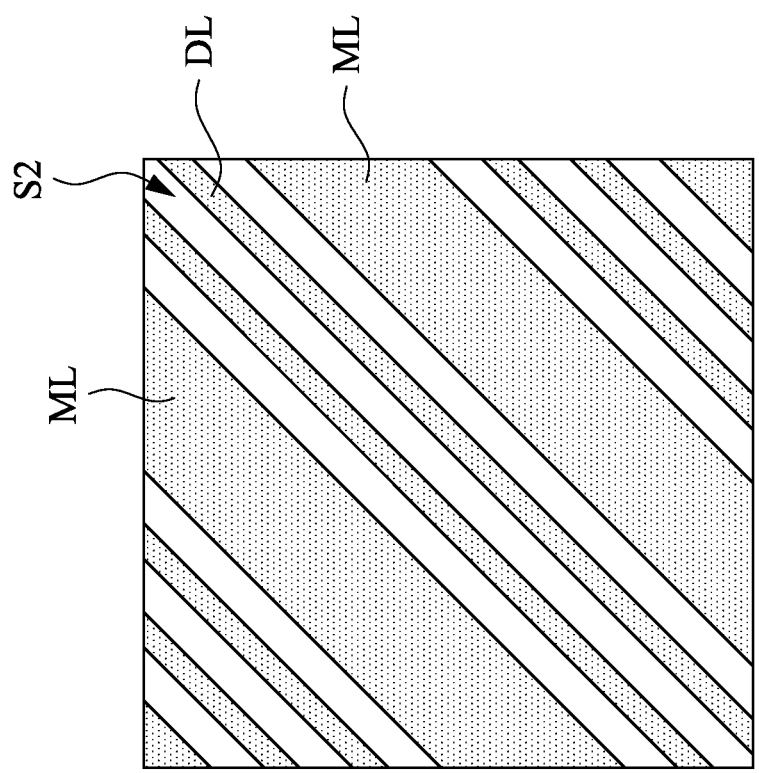
FIG. 3B is a top view of a mark pattern of the integrated circuit design layout of FIG. 3A.

FIG. 3B is a top view of a mark pattern MP' of the integrated circuit design layout ICD' of FIG. 3A. In the present embodiments, the density of the mark pattern MP (referring to FIG. 2B) is adjusted and increased by adding dummy lines DL into the space S1 between the main lines ML according to the pattern density obtained at step 104. For example, the dummy lines DL are inserted into the spaces S1, such that one of the spaces S1 (referring to FIG. 2B) is divided in to plural spaces S2 between two of the main lines ML and the dummy lines DL. The main lines ML and the dummy lines DL may extend along the same direction. In some embodiments, a width of the main lines ML is greater than that of the dummy lines DL. In some embodiments, the mark density is referred to as a ratio of the non-recessed area of the mark pattern to the area of the alignment mark. Due to the presence of the dummy lines DL, the non-recessed area of the mark pattern is increased, thereby increasing the mark density. In some other embodiments, the density of the mark pattern may be reduced by removing a portion of the main lines ML, thereby enlarging the spaces S1 (referring to FIG. 2B).

In the present embodiments, the density is calculated based on non-recessed areas or non-recessed portions. For example, the density of the mark pattern MP (referring to FIG. 2B) is calculated by dividing a sum of areas of the main lines ML by a sum of areas of the main lines ML and the spaces S1, the density of the mark pattern MP' is calculated by dividing a sum of areas of the main lines ML and the dummy lines DL by a sum of areas of the main lines ML, the dummy lines DL, and the spaces S2, and the pattern density is a ratio of the non-recessed area to a combination of the recessed area and the non-recessed area. However, it should not limit the scope of the present disclosure, and in some other embodiments, the density may be calculated based on recessed area or recessed portions. For example, the density of the mark pattern MP (referring to FIG. 2B) is calculated by dividing a sum of areas of the spaces S1 by a sum of area of the main lines ML and the spaces S1, the density of the mark pattern MP' is calculated by dividing a sum of areas of the spaces S2 by a sum of area of the main lines ML, the dummy lines DL, and the spaces S2, and the pattern density is a ratio of the recessed area to a combination of the recessed area and the non-recessed area.

Figure 4:
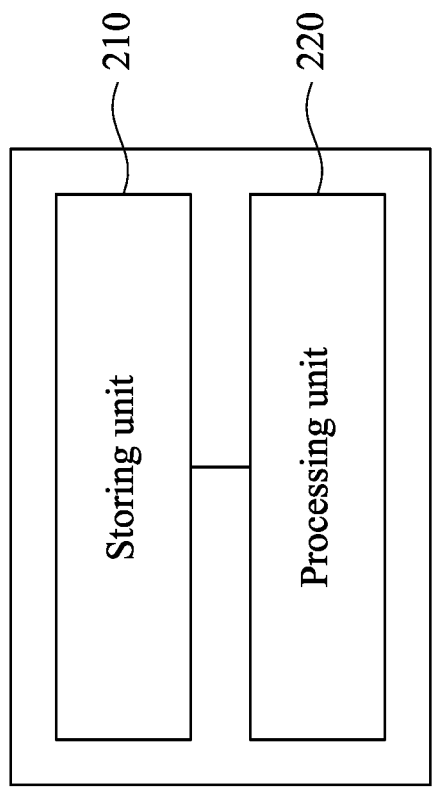
FIG. 4 is a block diagram of a computing device for performing the steps for preparing an IC design layout for fabrication process according to some embodiments of the present disclosure.

Reference is made to FIGS. 1 to 4. FIG. 4 is a block diagram of a computing device 200 for performing the steps 102-106 for preparing the IC design layout ICD' for fabrication process according to some embodiments of the present disclosure. The computing device 200 is used to receive the integrated circuit (IC) design layout ICD, and then adjust and prepare the IC design layout ICD'. The computing device 200 may be a single computer or a distributed computer. The computing device 200 may include a storage unit 210 and a processing unit 220. The storage unit 210 may receive and store the IC design layout ICD. In some embodiments, storage unit 210 includes, but is not limited to, random access memory (RAM), read-only memory (ROM), electrically-erasable programmable read-Only memory (EEPROM), flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by computing device 200. Any such computer storage media is part of computing device 200. The processing unit 220 are connected with the storage unit 210 for obtaining the IC design layout ICD and generating the IC design layout ICD'. In some embodiments, the processing unit 220 includes one or more software program for calculating the pattern density, performing the density comparison, and modifying and designing the IC design layout.

Figure 5:
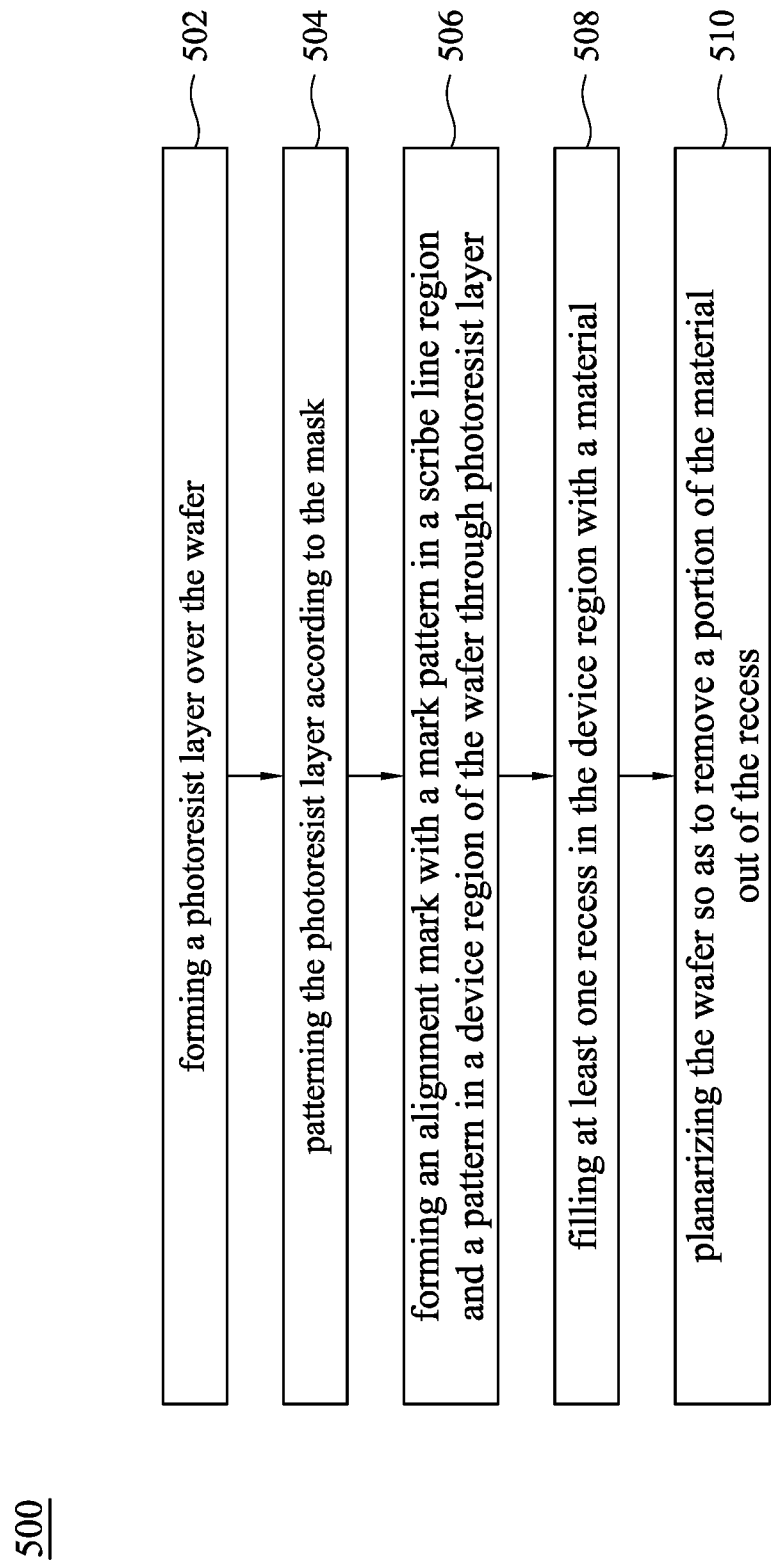
FIG. 5 is a flow chart of a method for manufacturing a semiconductor device according to some embodiments of the present disclosure.

FIG. 5 is a flow chart of a method for fabricating a semiconductor device according to some embodiments of the present disclosure. FIGS. 6A-6E illustrate various stages of a method 500 for fabricating a semiconductor device in accordance with some embodiments respectively. The method 500 includes steps 502-510. It is understood that additional steps may be implemented before, during, or after the method 500, and some of the steps described may be replaced or eliminated for other embodiments of the method 500.

Figure 6A:
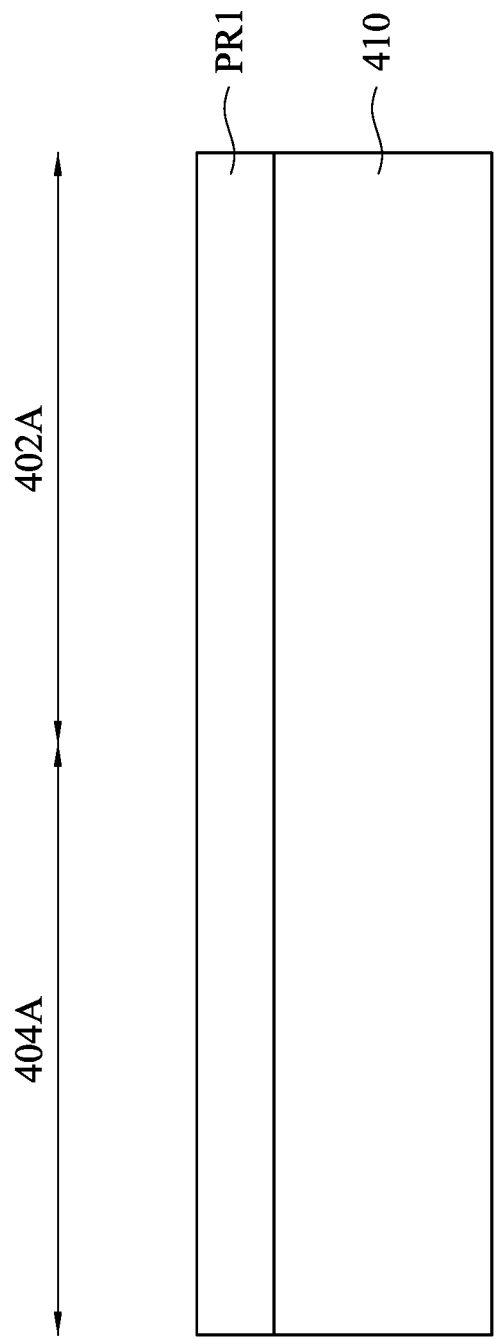

Reference is made to FIG. 5 and FIG. 6A. The method 500 begins at step 502 where a photoresist layer PR1 is formed over a wafer 400. The wafer 400 has at least one chip region 402A and at least one scribe line region 404A. Herein, the wafer 400 has a substrate 410. The substrate 410 may be a bulk silicon substrate. Alternatively, the substrate 410 may include an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or combinations thereof. Possible substrates 410 also include a silicon-on-insulator (SOI) substrate. SOI substrates are fabricated using separation by implantation of oxygen (SIMOX), wafer bonding, and/or other suitable methods.

The substrate 410 may also include various doped regions. The doped regions may be doped with p-type dopants, such as boron or $BF_2$; n-type dopants, such as phosphorus or arsenic; or combinations thereof. The doped regions may be formed directly on the substrate 410, in a P-well structure, in an N-well structure, in a dual-well structure, and/or using a raised structure. The substrate 410 may further include various active regions, such as regions configured for an N-type metal-oxide-semiconductor transistor device and regions configured for a P-type metal-oxide-semiconductor transistor device. The photoresist layer PR1 may include suitable flowable materials, such as organic materials. The photoresist layer PR1 may be positive or negative photoresist. In some embodiments, prior to the formation of the photoresist layer PR1, a mask layer may be optionally formed over the substrate 410.

Figure 6B:
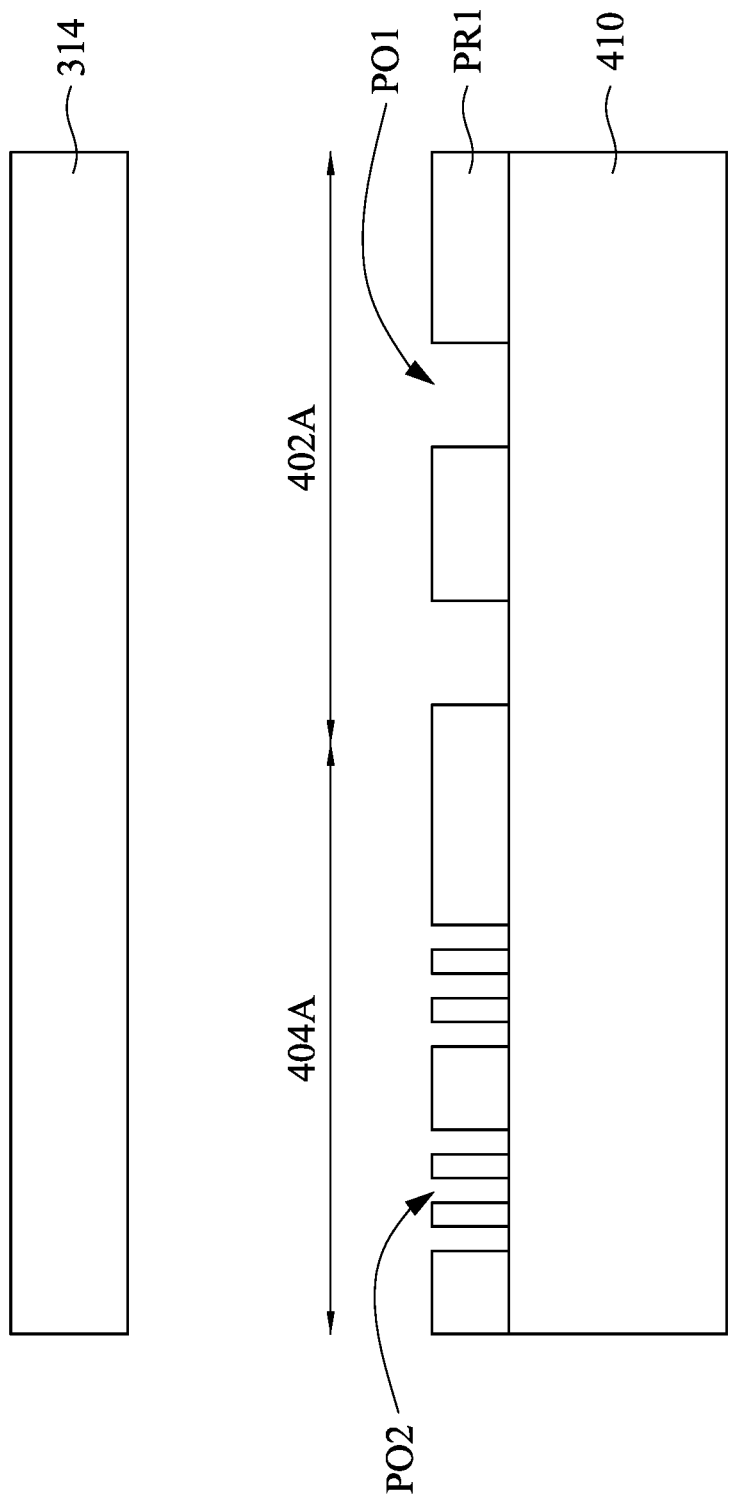

Reference is made to FIG. 5 and FIG. 6B. The method 500 proceeds to step 504 where the photoresist layer PR1 is patterned according to the layout ICD' for fabrication process generated at step 108 (referring to FIG. 3A). Herein, a mask 314 is manufactured and generated according to the layout ICD' (referring to FIG. 3A), a lithography process is performed on a wafer using the mask 314. To be specific, an exposure device 310 (referring to FIG. 10) radiates a radiation energy having a pattern corresponding the mask 314, so as to expose the photoresist layer PR1. The detail configurations of the exposure device 310 is illustrated later. In some other embodiments where the mask 314 is not used during the exposing processes, an exposure device receives a signal carrying the IC design layout ICD' in FIG. 3A from the computing device 200 (referring to FIG. 4) and adjust the pattern of radiation energy of the radiation source correspondingly, thereby exposing the photoresist layer PR1.

When the exposed photoresist layer PR1 is further developed, various openings are formed in the photoresist layer PR1, resulting in a patterned photoresist layer PR1. For example, the patterned photoresist layer PR1 has a first opening pattern PO1 in the chip region 402A and a second opening pattern PO2 in the scribe line region 404A. The first opening pattern PO1 corresponds with the circuit pattern (not shown) in the chip region DR in FIG. 3A. The second opening pattern PO2 corresponds with the designed mark pattern MP' in scribe line region SR in FIG. 3A.

Figure 6C:
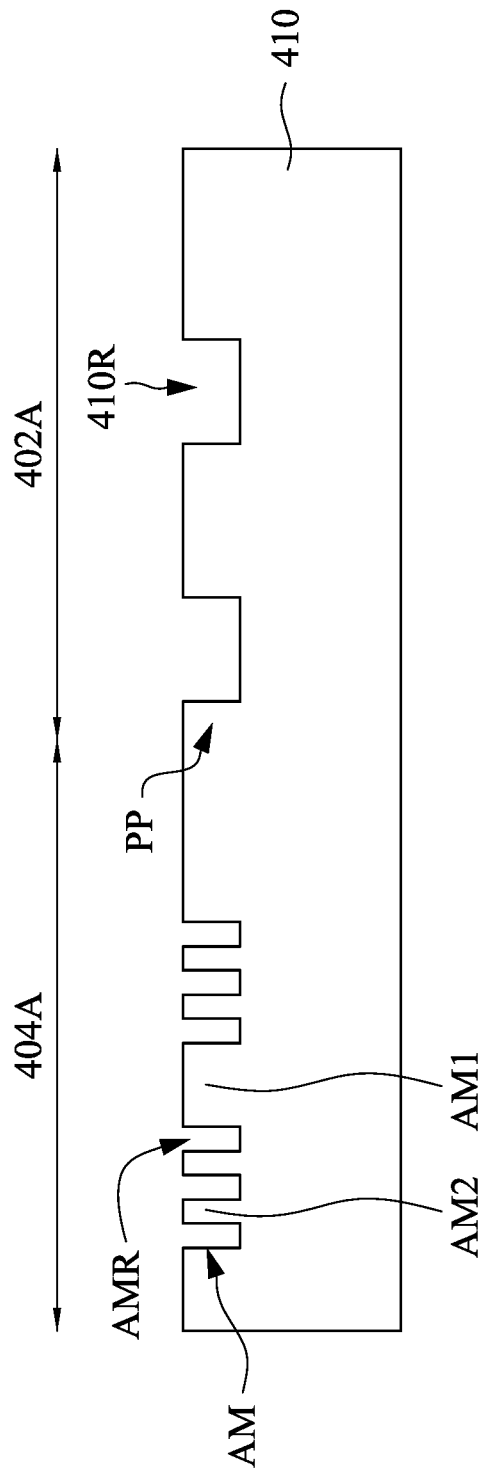

Reference is made to FIG. 5 and FIG. 6C. The method 500 proceeds to step 506 where an etching process is performed to the substrate 410, such that portions of the substrate 410 exposed by the opening pattern PO1 and PO2 of the photoresist PR1 are removed, and the remaining portions of the substrate 410 forms the circuit pattern PP in chip region 402A and an alignment mark AM in scribe line region 404A. Herein, a suitable etch process such as reactive ion etching (RIE) is performed. The photoresist layer PR1 may have higher etch resistance to the etch process than that of the substrate 410, such that portions of the substrate 410 covered by the photoresist layer PR1 remain intact after the etching process. In some embodiments where a mask layer is between the substrate 410 and the photoresist PR1, the mask is patterned first, and then the substrate 410 is etched through the patterned mask. In the present embodiments, the formed alignment mark AM has main lines AM1 and dummy lines AM2, in which the main lines AM1 and the dummy lines AM2 are separated from each other by the recesses AMR.

Through the aforementioned steps, the alignment mark AM in the scribe line region 404A may have a density similar to that of the circuit pattern PP the chip region 402A. For example, the ratio of the area of the recesses AMR to an area of the alignment mark AM (or the scribe line region 404A) is similar to the ratio of the area of recesses 410R to a combination of the chip region 402A and the scribe line region 404A. In some embodiments, a tolerance range from about 0% to about 10% may be given, as illustrated in FIG. 3A.

In some embodiments, the density is calculated based on non-recessed portions. For example, the density of the alignment marks AM is calculated by dividing a sum of areas of the main lines AM1 and the dummy lines AM2 by a sum of area of the main lines AM1, the dummy lines AM2, and the recesses AMR. The density of the circuit pattern PP is calculated by dividing a sum of non-recessed area of the chip region 402A (e.g., an area of the chip region 402A excluding the areas of the recesses 410R) by the area of the chip region 402A. However, it should not limit the scope of the present disclosure, and in some other embodiments, as aforementioned, the density is calculated based on recessed portions. For example, a density of the alignment marks AM is calculated by dividing a sum of areas of the recesses AMR by a sum of areas of the main lines AM1, the dummy lines AM2, and the recesses AMR. The density of the circuit pattern PP is calculated by dividing a sum of the areas of the recesses 410R by an area of the chip region 402A.

Reference is made to FIG. 5 and FIG. 6D. The method 500 proceeds to step 508 where a feature material 420 is formed in the recesses 410R. In some embodiments, the feature material 420 may overfill the recesses 410R. In some embodiments, the feature material 420 may be made of dielectric materials, such as silicon oxide, silicon nitride, the combination thereof, or other suitable materials. In some embodiments, the feature material 420 may be made of semiconductor materials, such as SiGe, SiP, the combination thereof, or other suitable materials. In some embodiments, the feature material 420 may be epitaxially grown from the exposed surface of the substrate 410. In some embodiments, the feature material 420 may be made of conductors, such as metals, alloys, the combination thereof, or other suitable materials.

Reference is made to FIG. 5 and FIG. 6E. The method 500 proceeds to step 510 where the wafer 400 is planarized so as to remove a portion of the feature material 420 out of the recess 410R and form the features 422. For example, the planarization includes a chemical mechanical polish (CMP) process.

CMP is a process that utilizes the reagent within slurry to react chemically with the front face of the wafer, and produce an easily polished layer. Such slurry may contain some active polishing ingredients such as abrasive particles. The abrasive particles are made of aluminum oxide, silicon oxide or cerium oxide, for example. Together with the abrasive action provided by the abrasive particles in the slurry under a polishing pad, the portions of the wafer are gradually removed. By repeating the foregoing chemical reaction and mechanical polishing steps, the front surface of the wafer 400 is planarized. A number of variables can affect the CMP process. These include the pressure applied to the polishing head, the planarity of the wafer 400, the rotational speed of the wafer 400 and the polishing pad, the chemical composition of the slurry and the abrasive particles, the operating temperature, the material and abrasive properties of the polishing pad, and so on. After the CMP process, de-ionized water may be used to clear away residue from the CMP process, such as the slurry and abrasive particles on the wafer.

In the absence of the dummy lines AM2, some alignment marks may be subject to dishing effects of CMP, resulting in potential deformation of the alignment mark, such as profile asymmetry. In some embodiments of the present disclosure, the alignment mark AM is designed to have dummy lines AM2, such that the overall density of the alignment mark AM is increased, which in turn will ease the consumption of the alignment mark AM during a CMP process. Furthermore, the alignment mark AM has a density similar to that of the primary pattern PP in the chip region 402A, such that the alignment mark AM and the primary pattern PP may have similar loadings to the CMP process. Through the configuration, the alignment mark AM provides pattern uniformity for minimizing dishing effects during various fabrication stages, such as CMP processes. Additional layers or features may be formed thereon by the alignment with respect to the alignment mark AM.

Figure 7A:
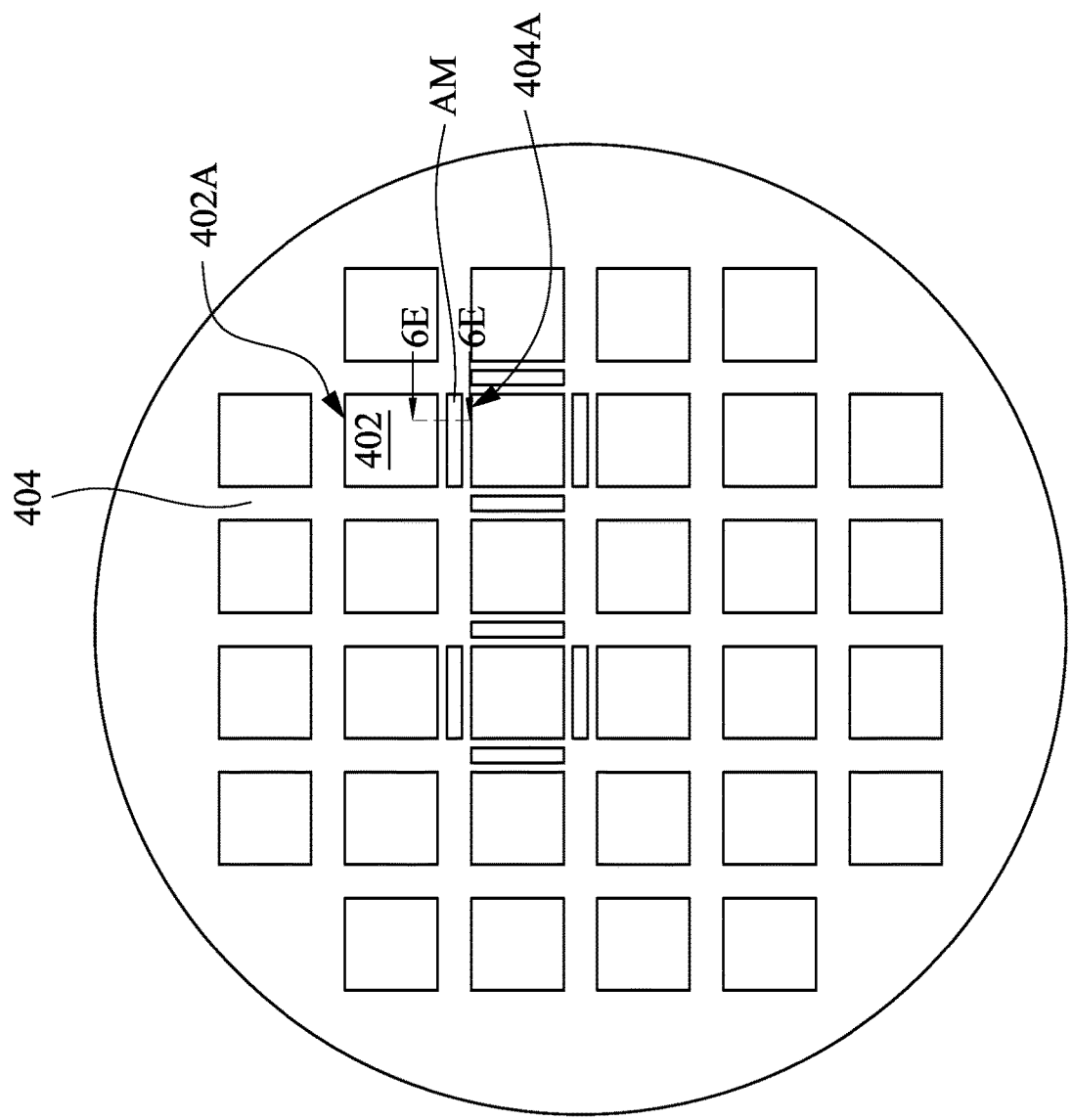
FIG. 7A is a top view of a wafer according to some embodiments of the present disclosure.

FIG. 7A is a wafer 400 having an alignment mark AM according to some embodiments of the present disclosure. In some embodiments, FIG. 6E is a cross-sectional view taken along line 6E-6E in FIG. 7A. The wafer 400 includes dies 402 aligned as rows and columns, and scribe lines 404 separating dies 402 in neighboring rows and columns from each other. The dies 402 and the scribe lines 404 are respectively in the chip region 402A and the scribe line region 404A in FIG. 6E. Scribe lines 404 are used to saw dies 402 apart in the subsequent die-saw process. Dies 402 are used to form integrated circuit devices such as transistors, photo diodes, resistors, capacitors, and/or the like, therein. In some embodiments, the wafer 400 is chipped to form plural individual dies 402.

Figure 7C:
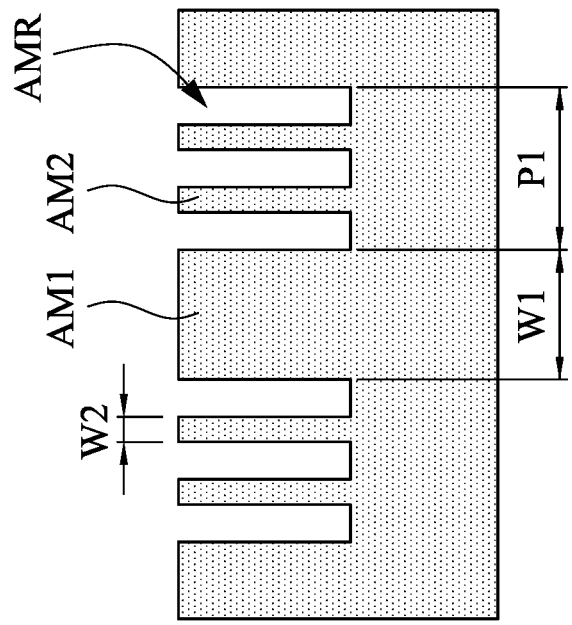
FIG. 7C is a cross-sectional view taken along line 7C-7C in FIG. 7B.
Figure 7B:
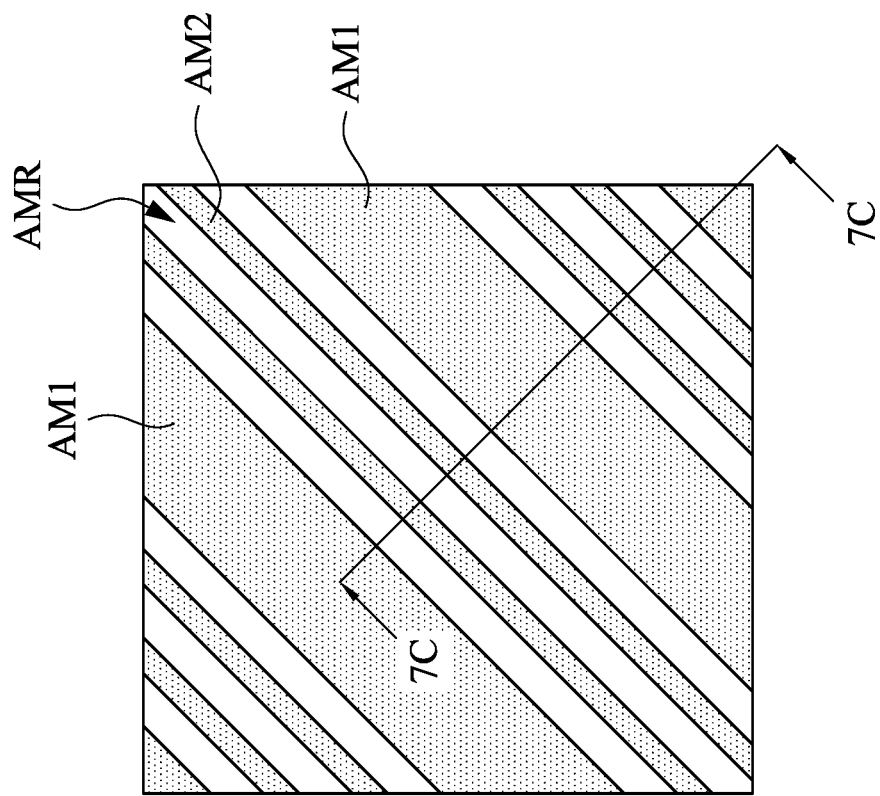
FIG. 7B is a top view of an alignment mark at in accordance with some embodiments.

FIG. 7B is a top view of an alignment mark AM at in accordance with some embodiments. FIG. 7C is a cross-sectional view of taken along line 7C-7C in FIG. 7B. The alignment mark AM includes main lines AM1 and dummy lines AM2. The main lines AM1 and the dummy lines AM2 may extend along the same direction. The main lines AM1 are separating from each other by a combination of the recesses AMR and the dummy lines AM2. A width W1 of the main lines AM1 is greater than a width W2 of the dummy lines AM2. In some embodiments, the main lines AM1 are separating from each other by a pitch PI. A width of the dummy lines AM2 is less than the pitch PI, such that the plural dummy lines AM2 can be between two of the main lines AM1. In some embodiments, the width W1 of the main lines AM1 is greater than or less than the pitch PI. In some embodiments, the pitch PI may be equal to the width W1.

In the absence of the dummy lines AM2, Rn unstable issue on oxide diffusion (OD) stage may occur, such that different chip regions 402A on OD stage may have top surfaces at different vertical positions. Rn is referred to as the erosion rate (e.g., the CMP rate) in the normal direction at a point on the surface of the wafer. In the present embodiments, through the addition of the dummy lines AM2, the Rn unstable issue on OD stage can be solved. For example, the number, width, and pitches of the dummy lines AM2 may be locally adjusted for solving the Rn unstable issue. Through the configuration, the residual overlay is improved, and the residual overlay performance indicator (ROPI) is minimize.

Figure 8:
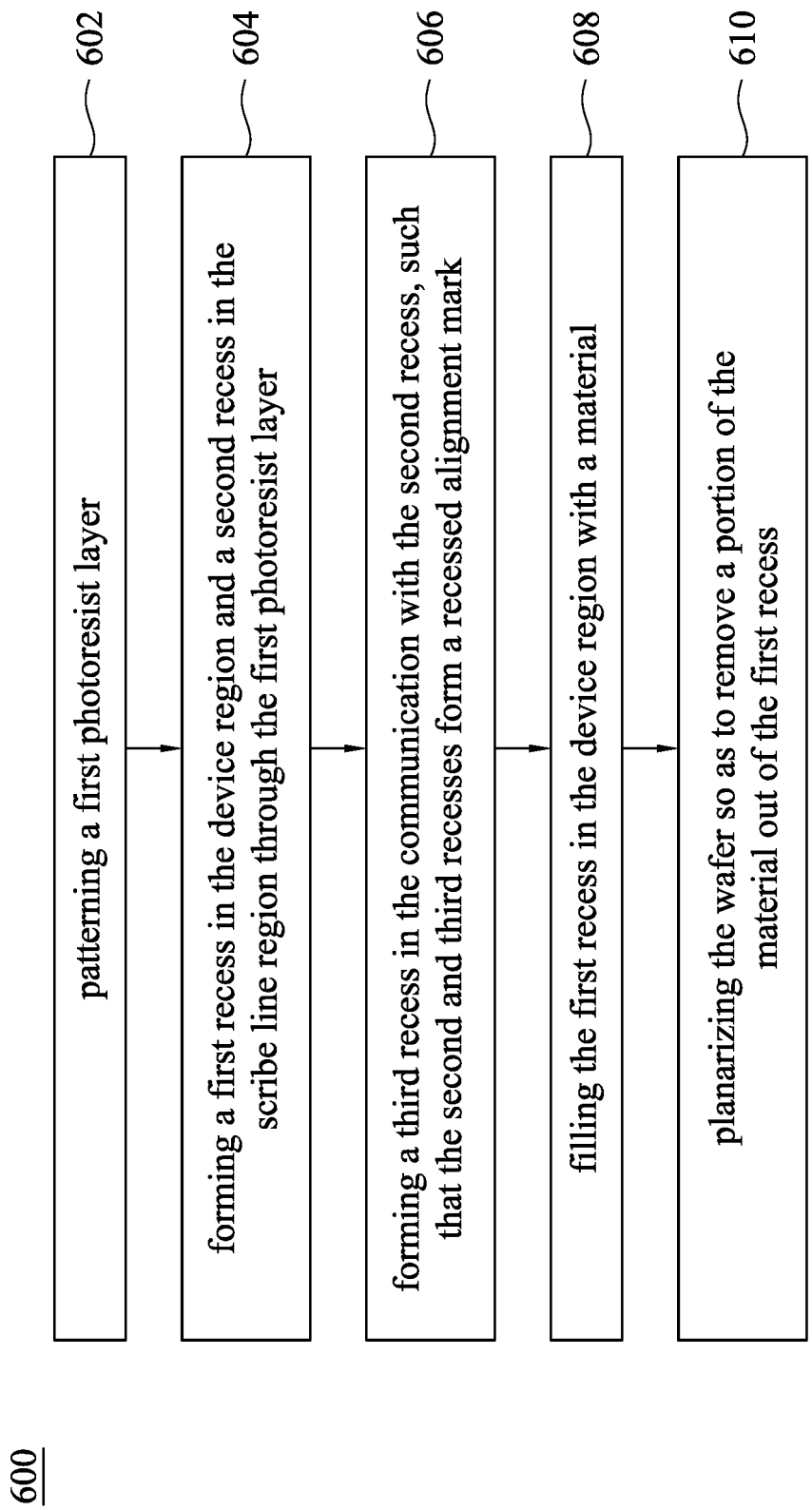
FIG. 8 is a flow chart of a method for fabricating a semiconductor device according to some embodiments of the present disclosure.

FIG. 8 is a flow chart of a method 600 for fabricating a semiconductor device according to some embodiments of the present disclosure. FIGS. 9A-9E illustrate various stages of a method 600 for fabricating a semiconductor device in accordance with some embodiments. The method 600 includes steps 602-610. It is understood that additional steps may be implemented before, during, or after the method 600, and some of the steps described may be replaced or eliminated for other embodiments of the method 600.

Reference is made to FIG. 8 and FIG. 9A. The method 600 begins at step 602 where a photoresist layer PR1 is formed over a substrate 410 with a first opening pattern PO1 in a chip region 402A of the wafer 400 and a second opening pattern PO2 in a scribe line region 404A. The first opening pattern PO1 corresponds with the primary pattern to be formed of the IC design layout. The second opening pattern PO1 corresponds with a mark pattern.

Reference is made to FIG. 8 and FIG. 9B. The method 600 proceeds to step 604 where an etching process is performed to the substrate 410, such that a first recess R1 is formed in the chip region 402A and second recesses R2 are formed in the scribe line region 404A. Herein, a suitable etch process such as reactive ion etching (RIE) is performed. To be specific, portions of the substrate 410 exposed by the first and second opening patterns PO1 and PO2 of the photoresist layer PR1 is etched and removed, and recesses R1 and R2 are formed. Herein, the photoresist layer PR1 has higher etch resistance to the etch process than that of the substrate 410, such that portions of the substrate 410 covered by the photoresist layer PR1 remain intact after the etching process.

Reference is made to FIG. 8 and FIG. 9C. The method 600 proceeds to step 606 where portions of the substrate 410 exposed by the recess R2 is further etched and removed, and the recess R3 is formed. That is, the recess R3 is formed in a bottom of the recesses R2. The recess R3 is formed in the communication with the recess R2, such that the recesses R2 and R3 form a recessed alignment mark AM. Herein, a photoresist layer PR2 is formed over the structure of FIG. 9B, and has an opening PO3 with a width smaller than that of the recess R2. The photoresist layer PR2 has higher etch resistance to the etch process than that of the substrate 410, such that portions of the substrate 410 covered by the photoresist layer PR2 remain intact after the etching process. Through the configuration, the recess R3 has a width less than that of the recess R2. The alignment mark AM has a step sidewall ST having an edge IE, and a top of the edge IE is lower than a top surface 410S of the substrate 410. In some embodiments, the edge IE is vertical to the top surface 410S. In some embodiments, the alignment mark AM has a portion SP exposed by the recess R2.

Reference is made to FIG. 8 and FIG. 9D. The method 600 proceeds to step 608 where a feature material 420 is formed in the recesses R1. In some embodiments, the feature material 420 may overfill the recesses R1. In some embodiments, the feature material 420 may be made of dielectric materials, such as silicon oxide, silicon nitride, the combination thereof, or other suitable materials. In some embodiments, the feature material 420 may be made of semiconductor materials, such as SiGe, SiP, the combination thereof, or other suitable materials. In some embodiments, the feature material 420 may be epitaxially grown from the exposed surface of the substrate 410. In some embodiments, the feature material 420 may be made of conductors, such as metals, alloys, the combination thereof, or other suitable materials.

Figure 9E:
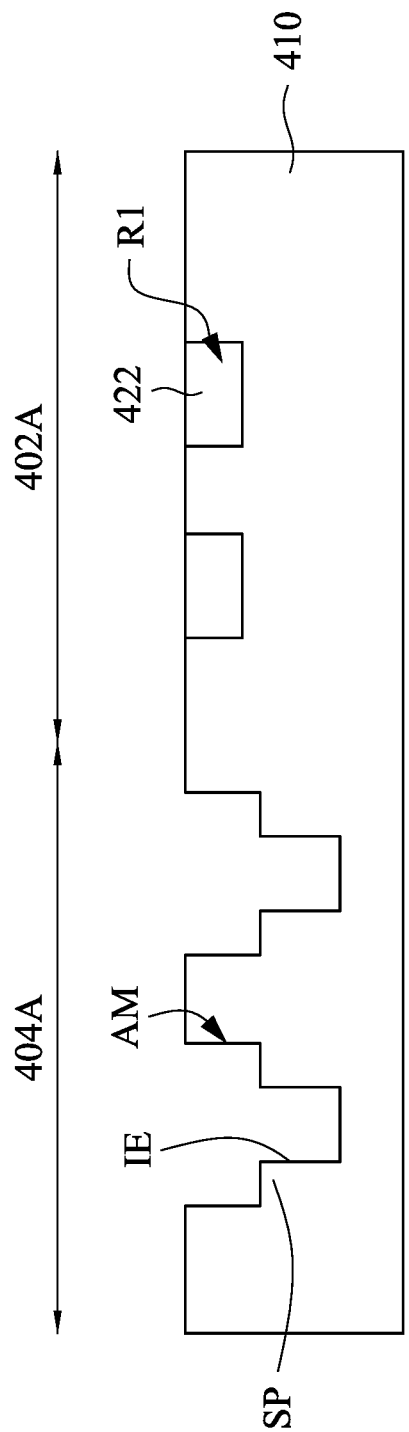

Reference is made to FIG. 8 and FIG. 9E. The method 600 proceeds to step 610, where the wafer 400 is planarized so as to remove a portion of the feature material 420 out of the recess R1 and form the features 422 in the recesses R1. For example, the planarization includes a chemical mechanical polish (CMP) process.

Herein, since the top of the edge IE is lower than a top surface of the substrate 410, when the substrate 410 is polished by the CMP process, the edge IE is prevented from being destroyed by the CMP process. The edge IE remains intact after the CMP process. For example, a light reflected by the intact step sidewall is detected and measured by the monitor 326 (referring to FIG. 10) with strong signal intensity for alignment measurement. Additional layers or features may be formed thereon by the alignment with respect to the alignment mark AM. As aforementioned, the feature 422 may be made of conductor materials, semiconductor materials, or dielectric materials. Other details are similar to those described in previous embodiments, and therefore not repeated herein.

Figure 10:
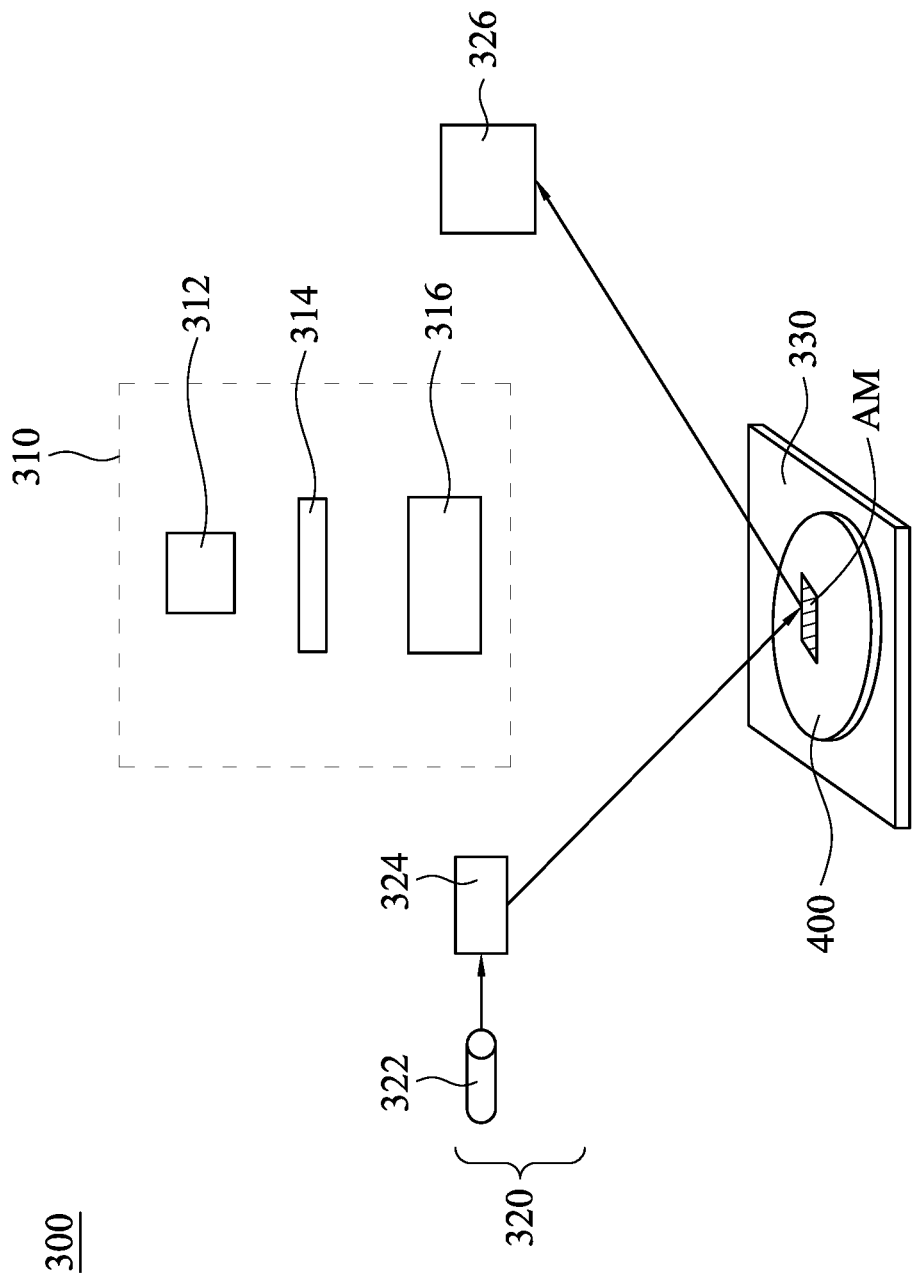
FIG. 10 is a schematic view of a lithography system according to some embodiments of the present disclosure.

FIG. 10 is a schematic view of a lithography system 300 according to some embodiments of the present disclosure. The lithography system 300 includes an exposure device 310, an alignment device 320, and a stage 330. The exposure device 310 is used to perform a lithography exposure process to a resist layer coated on the wafer 400.

The exposure device 310 includes a radiation source 312, a mask 314, and an optical module 316. The radiation source 312 is configured to provide a radiation energy to the wafer 400. The mask 314 is configured to provide the radiation energy from the radiation source 312 with a pattern. The optical module 316 is configured to modulate and direct the radiation energy having the pattern to the wafer 400. Herein, there may be plural different masks 314 for providing patterns for different layers of the wafer 400. In some other embodiments, at least one of the masks 314 is generated based on the layout ICD' for fabrication process ICD' in FIG. 3A. In some other embodiments, the exposure device 310 is coupled with the computer 200 (referring to FIG. 4) for receiving the layout ICD' for fabrication process in FIG. 3A, and the mask 314 is not used.

In some embodiments, the radiation source 312 may be any radiation source suitable for exposing a resist layer. In various examples, the radiation source 312 may include a light source selected from the group consisting of ultraviolet (UV) source, deep UV (DUV) source, extreme UV (EUV) source, and X-ray source. In alternative embodiments, the radiation source 312 is an electron beam (e-beam) source for exposing a resist layer by a proper mode, such as direct writing. In such a case, the mask 314 is not used during the exposing processes.

In some embodiments, the mask 314 includes a transparent substrate and a patterned absorption layer. The transparent substrate may use fused silica (SiO2) relatively free of defects, such as borosilicate glass and soda-lime glass. The absorption layer may include a metal film such as chromium (Cr) for absorbing light directed thereon. The absorption layer is further patterned to have one or more openings in the metal film through which a light beam may travel without being completely absorbed. In some other embodiments where the radiation source 312 generates EUV radiation, the mask 314 is designed to have reflective mechanism. For example, the mask 314 may include a substrate coated with tens of alternating layers of silicon and molybdenum to act as a Bragg reflector that maximizes the reflection of EUV light. In some embodiments, plural masks 314 are used for patterning plural separate layers.

The optical module 316 may be designed to have a refractive mechanism or reflective mechanism. In a refractive mechanism, the optical module 316 includes various refractive components, such as lenses. In a reflective mechanism, the optical module 316 includes various reflective components, such as mirrors.

The alignment device 320 is coupled with the exposure device 310. In some embodiments, the alignment device 320 measures a position information of an alignment mark AM on the wafer 400. The alignment mark AM herein may stand for the alignment mark AM in FIG. 6E or 9E. The stage 330 holding the wafer 400 or a stage holding the masks 314 may move based on the measurement result, so as to align some of the masks 314 with respect to the alignment mark AM on the wafer 400.

In some embodiments, referring to FIG. 10, the alignment device 320 includes a light source 322, an optical assembly 324, and a monitor 326. The light source 322 is configured to emit a light beam. The light source 322 may be coherent or incoherent. In some embodiments, the light source 322 is capable of emitting a visual light, an infrared light, a near-infrared (NIR) light, a far-infrared (FIR) light, a violet light, a ultra-violet (UV) light, or a combination thereof. In some embodiments, the light source 322 is a laser source such as a solid state laser source, a dye laser source, or another suitable laser source. The light beam may have one or more wavelengths and at least one of the wavelengths is suitable for alignment measurement. For example, the light beam may have a wavelength of 532 nanometer (nm), 633 nm, 780 nm, 850 nm, or a combination thereof.

In some embodiments, the optical assembly 324 includes optical components such as polarizers, lens, mirrors, beam splitters, and/or fiber optics. The optical assembly 324 receives the light beam from the light source 322 and projects a modulated light beam onto a target device (such as a wafer 400), positioned on a substrate stage 330.

In some embodiments, the substrate stage 330 is operable to move such that the modulated light beam scans through one or more alignment marks AM. The modulated light beam reflected off the alignment mark AM, carries imaging information about the alignment mark. The light beam is collected by the monitor 326 for alignment or overlay analysis. In some embodiments, the monitor 326 includes light sensors and other optical components such as lens, beam splitters, and/or cameras. The monitor 326 may further include a computer which calculates alignment measurement or overlay measurement. The lithography system 300 may further include an alignment control unit designed to control the alignment based on the alignment measurement.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the alignment mark may provide pattern uniformity for minimizing dishing effects during various fabrication stages. Another advantage is that since the alignment mark is less damaged, the residual overlay performance indicator is minimized, and the overlay alignment is improved. Still another advantage is that the alignment marks with the step sidewall provides strong signal intensity for alignment measurement, thereby reducing SNR (signal-to-noise ratio) and benefiting alignment measurement.

According to some embodiments of the present disclosure, a method for fabricating a semiconductor device is provided. The method includes forming an alignment mark in a material layer, wherein the alignment mark has a step sidewall in the material layer, and the step sidewall of the alignment mark has a floor surface portion; forming a feature material over the material layer; and performing a planarization process at least on the feature material, wherein the planarization process stops at a level higher than the floor surface portion of the step sidewall of the alignment mark.

According to some embodiments of the present disclosure, a method for fabricating a semiconductor device is provided. The method includes etching a first recess and a second recess in a top surface of a material layer; etching a third recess in a bottom surface of the first recess, wherein the third recess is narrower than the first recess, and the first recess and the third recess form an alignment mark; overfilling the second recess with a feature material; and removing an upper portion of the feature material that is higher than the top surface of the material layer.

According to some embodiments of the present disclosure, a method is provided. The method includes forming an alignment mark in a material layer, wherein the alignment mark has a sidewall having a upper portion extending downwards from a top surface of the material layer, a middle portion with first and second ends and extending starting from the first end thereof laterally from a bottom end of the upper portion and a lower portion extending downwards from the second end of the middle portion; forming a feature material over the material layer; and performing a planarization process at least on the feature material, wherein a top surface of the feature material is higher than a top end of the lower portion of the sidewall of the alignment mark after the planarization process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming an alignment mark in a material layer, wherein the alignment mark has a step sidewall in the material layer, the step sidewall of the alignment mark has a floor surface portion, and the material layer is a single piece of continuous material;
   forming a feature material over the material layer; and
   performing a planarization process at least on the feature material and a top end of the step sidewall of the alignment mark such that a top surface of the feature material is substantially level with a top end of the step sidewall of the alignment mark, wherein the planarization process stops at a level higher than the floor surface portion of the step sidewall of the alignment mark, and forming the feature material and the planarization process are performed such that the floor surface portion of the step sidewall of the alignment mark is free from coverage by the feature material during the planarization process.

2. The method of claim 1, wherein forming the alignment mark comprises:
   forming a first recess in the material layer; and
   forming a second recess in a bottom surface of the first recess, wherein a width of the first recess is greater than a width of the second recess.

3. The method of claim 1, wherein forming the feature material is performed such that a bottom surface of the feature material is higher than the floor surface portion of the step sidewall of the alignment mark.

4. The method of claim 1, wherein forming the feature material is performed such that a bottom surface of the feature material is higher than a bottom surface of the alignment mark.

5. The method of claim 1, further comprising:
   detecting light reflected by the step sidewall of the alignment mark after the planarization process.

6. A method, comprising:
   etching a first recess and a second recess in a top surface of a material layer;
   after etching the first recess and the second recess in the top surface of the material layer, etching a third recess in a bottom surface of the first recess, wherein the third recess is narrower than the first recess, and the first recess and the third recess form an alignment mark, wherein a bottom surface of the third recess is lower than a bottom surface of the second recess;
   overfilling the second recess with a feature material; and
   removing an upper portion of the feature material that is higher than the top surface of the material layer, wherein overfilling the second recess with the feature material and removing the upper portion of the feature material are performed such that the alignment mark formed by the first recess and the third recess is free of the feature material after overfilling the second recess with the feature material and prior to removing the upper portion of the feature material.

7. The method of claim 6, further comprising:
   forming a resist layer covering a first portion of the bottom surface of the first recess prior to etching the third recess, wherein a second portion of the bottom surface of the first recess is free from coverage by the resist layer.

8. The method of claim 7, wherein forming the resist layer is performed such that the resist layer further covers the second recess.

9. The method of claim 6, wherein removing the upper portion of the feature material is performed such that a remaining portion of the feature material has a top surface higher than the bottom surface of the first recess.

10. The method of claim 6, wherein removing the upper portion of the feature material is performed such that a remaining portion of the feature material has a top surface substantially level with the top surface of the material layer.

11. The method of claim 6, wherein overfilling the second recess with the feature material comprises:
    epitaxially growing the feature material.

12. The method of claim 6, wherein etching the third recess is performed such that the third recess is narrower than the second recess.

13. A method, comprising:
    forming an alignment mark in a material layer, wherein the alignment mark has a sidewall having a upper portion extending downwards from a top surface of the material layer, a middle portion with first and second ends and extending starting from the first end thereof laterally from a bottom end of the upper portion and a lower portion extending downwards from the second end of the middle portion;
    forming a semiconductive feature over the material layer; and
    performing a planarization process at least on the semiconductive feature and a top end of the sidewall of the alignment mark such that a top surface of the semiconductive feature is substantially level with the top end of the sidewall of the alignment mark, wherein the top surface of the semiconductive feature is higher than a top end of the lower portion of the sidewall of the alignment mark after the planarization process, and forming the semiconductive feature and the planarization process are performed such that the middle portion of the sidewall of the alignment mark is free from coverage by the semiconductive feature during the planarization process.

14. The method of claim 13, wherein the top surface of the semiconductive feature is higher than the bottom end of the upper portion of the sidewall of the alignment mark after the planarization process.

15. The method of claim 13, wherein forming the semiconductive feature is performed such that a bottom surface of the semiconductive feature is higher than the top end of the lower portion of the sidewall of the alignment mark.

16. The method of claim 1, wherein the material layer is a semiconductor substrate, and the feature material comprises a semiconductive material.

17. The method of claim 1, wherein the feature material comprises a dielectric material.

18. The method of claim 13, wherein forming the semiconductive feature and the planarization process are performed such that the lower portion of the sidewall of the alignment mark is free from coverage by the semiconductive feature during the planarization process.

19. The method of claim 13, wherein forming the semiconductive feature and the planarization process are performed such that the upper portion of the sidewall of the alignment mark is free from coverage by the semiconductive feature during the planarization process.

20. The method of claim 13, wherein the semiconductive feature comprises SiGe.

* * * * *